(12) United States Patent
Ransdell

(10) Patent No.: US 11,608,910 B2
(45) Date of Patent: Mar. 21, 2023

(54) PIEZO VALVE, FLUID CONTROL DEVICE AND PIEZO VALVE DIAGNOSIS METHOD

(71) Applicant: HORIBA STEC, Co., Ltd., Kyoto (JP)

(72) Inventor: Jeffrey Ransdell, Irvine, CA (US)

(73) Assignee: HORIBA STEC, Co., Ltd., Kyoto (JP)

( * ) Notice: Subject to any disclaimer, the term of this patent is extended or adjusted under 35 U.S.C. 154(b) by 210 days.

(21) Appl. No.: 17/078,343

(22) Filed: Oct. 23, 2020

(65) Prior Publication Data

US 2021/0131587 A1     May 6, 2021

(30) Foreign Application Priority Data

Nov. 5, 2019 (JP) .............................. JP2019-200831

(51) Int. Cl.
| | |
|---|---|
| *F16K 37/00* | (2006.01) |
| *F16K 1/32* | (2006.01) |
| *F16K 31/00* | (2006.01) |
| *G01R 31/52* | (2020.01) |

(52) U.S. Cl.
CPC ............ *F16K 37/0041* (2013.01); *F16K 1/32* (2013.01); *F16K 31/007* (2013.01); *G01R 31/52* (2020.01); *F16K 31/004* (2013.01)

(58) Field of Classification Search
CPC .... F16K 37/0041; F16K 31/007; F16K 31/00; F16K 1/32; G01R 31/52
See application file for complete search history.

(56) References Cited

U.S. PATENT DOCUMENTS

| | | | | |
|---|---|---|---|---|
| 7,015,621 | B2 * | 3/2006 | Mizuuchi | H01L 41/042 |
| | | | | 310/317 |
| 2002/0011762 | A1 * | 1/2002 | Klenk | F02D 41/2096 |
| | | | | 310/316.03 |
| 2008/0218027 | A1 * | 9/2008 | Gottlieb | H01L 41/042 |
| | | | | 310/316.03 |
| 2018/0356845 | A1 * | 12/2018 | Yasuda | G05D 7/0635 |
| 2020/0166150 | A1 * | 5/2020 | Miyamoto | G05D 7/0635 |

FOREIGN PATENT DOCUMENTS

| | | | | |
|---|---|---|---|---|
| DE | 102012005994 | A * | 9/2013 | ............. F02D 41/20 |
| JP | 2009016799 | A | 1/2009 | |

\* cited by examiner

*Primary Examiner* — Giovanni Astacio-Oquendo
*Assistant Examiner* — Dilara Sultana
(74) *Attorney, Agent, or Firm* — Alleman Hall Creasman & Tuttle LLP

(57) ABSTRACT

In order to provide a piezo valve in which it is possible to accurately predict the remaining lifespan of a piezo actuator, there are provided a valve seat, a valve body that is able to move between a fully closed position in contact with the valve seat and a fully open position, a piezo actuator that drives the valve body, a drive circuit that receives an input signal, and outputs to the piezo actuator a corresponding drive voltage, and a leakage current detector that, when the drive circuit outputs a voltage equal to or greater than a maximum rated voltage that drives the valve body to the fully closed/open position, detects leakage current from the piezo actuator. When the leakage current is detected or in a state immediately prior to detection, a fluid is flowing between the valve seat and the valve body.

15 Claims, 6 Drawing Sheets

PIEZO VALVE, FLUID CONTROL DEVICE AND PIEZO VALVE DIAGNOSIS METHOD

TECHNICAL FIELD

The present invention relates to a piezo valve that is used, for example, in a semiconductor manufacturing process.

TECHNICAL BACKGROUND

In a semiconductor manufacturing process, a piezo valve equipped with a piezo actuator having superior responsiveness is used in order to provide high-speed control of a flow rate and pressure of a process gas. For example, in an ALD (Atomic Layer Deposition) process, a piezo valve is repeatedly turned ON and OFF at high speed in order to form a layer of a single atom (see Patent Document 1).

If a piezo valve is used continuously, damage and deterioration increase incrementally as a result, for example, of operations such as that described above, and these will eventually cause the piezo actuator to fail. For this reason, in order to guarantee accurate flow rate and pressure control, it is desirable that it be possible to accurately predict a timing when complete failure will occur.

However, currently, accurately predicting the remaining lifespan of a piezo valve is difficult, and piezo valves are often replaced at an early stage, even, in some cases, at times when they might still be regarded as having a sufficient remaining lifespan.

DOCUMENTS OF THE PRIOR ART

Patent Documents

Patent Document 1
Japanese Unexamined Patent Application (JP-A) No. 2009-016799

DISCLOSURE OF THE INVENTION

Problems to be Solved by the Invention

The present invention was therefore conceived in order to solve the above-described problem, and it is an object thereof to provide a piezo valve that enables a remaining lifespan of a piezo actuator to be accurately predicted.

Means for Solving the Problem

In other words, a piezo valve according to the present invention is provided with a valve seat, a valve body that is provided so as to be able to move between a fully closed position at which the valve body is in contact with the valve seat, and a fully open position, a piezo actuator that drives the valve body, a drive circuit that receives an input piezo control signal, and outputs to the piezo actuator a drive voltage that corresponds to the input piezo control signal, and a leakage current detector that, in a state in which the drive circuit is outputting as the drive voltage to the piezo actuator a voltage that is equal to or greater than a maximum rated voltage that drives the valve body to the fully closed position or the fully open position, detects leakage current from the piezo actuator, wherein, in a state in which the leakage current detector is detecting leakage current from the piezo actuator or in a state immediately prior to the leakage current detector detecting leakage current from the piezo actuator, a fluid is flowing between the valve seat and the valve body.

In addition, a piezo valve diagnosis method according to the present invention is a method of diagnosing a piezo valve provided with a valve seat, a valve body that is provided so as to be able to move between a fully closed position at which the valve body is in contact with the valve seat, and a fully open position, a piezo actuator that drives the valve body, and a drive circuit that receives an input piezo control signal, and outputs to the piezo actuator a drive voltage that corresponds to the input piezo control signal, is configured so as to include detecting leakage current from the piezo actuator in a state in which the drive circuit is outputting as the drive voltage to the piezo actuator a voltage that is equal to or greater than a maximum rated voltage that drives the valve body to the fully closed position or the fully open position, and enabling a fluid to flow between the valve seat and the valve body in a state in which leakage current from the piezo actuator is being detected or in a state immediately prior to leakage current from the piezo actuator being detected.

According to the above-described invention, it is possible to monitor leakage current from the piezo actuator even during a processing period when the piezo valve is in operation, and pressure and flow rate are actually being controlled. For this reason, it is possible to perform a substantially continuous diagnosis of the state of the piezo actuator without being limited, for example, to periods when processing is halted. Accordingly, compared to the conventional technology, it is possible to improve the prediction accuracy when predicting the remaining lifespan of a piezo actuator.

Moreover, because the leakage current detector detects leakage current when, during processing, a piezo valve is either fully closed or fully open, and a drive voltage that is equal to or larger than a maximum rated voltage is being output from the drive circuit, there are no effects on the pressure and flow rate control due to the detection of the leakage current.

In order to enable leakage current from the piezo actuator to be more accurately detected in a state in which the piezo valve is either fully closed or fully open, it is desirable that the leakage current detector detect leakage current when the drive circuit is in a state of outputting a drive voltage that is larger than the maximum rated voltage for a predetermined length of time. In other words, because the drive voltage applied to the piezo valve is provided with a sufficient margin by being restricted to a maximum rated voltage that is smaller than the allowable voltage by a predetermined value, even if leakage current does occur when the piezo valve is either fully closed or fully open, there is a possibility that the value of this leakage current will be so small as to make detection thereof difficult. Accordingly, for example, by applying a larger voltage than normal between the maximum rated voltage and the allowable voltage to the piezo actuator for a predetermined length of time when the piezo valve is either fully closed or fully open, it is possible to improve the leakage current detection accuracy without causing any decrease in performance in the control of the pressure and flow rate.

In order to enable a detection resistor that is used to detect leakage current to act on the piezo actuator only at the times when a leakage current is being detected, and to thereby inhibit the detection resistor from adversely affecting control during normal operations, it is desirable that the drive circuit be equipped with an amplifier that amplifies the input piezo control signal, and outputs the amplified piezo control signal to the piezo actuator as the drive voltage, and a first switching element that is provided between the piezo actuator and the ground, and that the leakage current detector be equipped with a second switching element that is provided in parallel with the first switching element, a detection resistor that is provided in series with the second switching element, and is formed so as to receive an inflow of the leakage current when the first switching element is in an OFF state and the second switching element is in an ON state, and a first voltage detection unit that detects a voltage generated in the detection resistor.

In order, for example, to enable the leakage current detector to be operated and leakage current to be monitored only at the times when a maximum rated voltage is being applied to the piezo actuator at a set pressure and a set flow rate that have been set by a user, it is desirable that there be further provided a first diagnosis timing control unit that, in a case in which the drive circuit is outputting a drive voltage equal to or greater than the maximum rated voltage, sets the first switching element to OFF, and sets the second switching element to ON.

In order to enable damage and deterioration to be detected from changes in the capacitance of the piezo actuator, and to thereby enable the remaining lifespan thereof to be predicted even more accurately, it is desirable that there be further provided a capacitance detector that, in a state in which the drive circuit is not outputting a drive voltage to the piezo actuator, detects a capacitance of the piezo actuator.

An example of a specific aspect that is used to detect a capacitance of the piezo actuator from changes in the voltage applied to the piezo actuator is a piezo valve in which the capacitance detector supplies a test current to the piezo actuator for a predetermined length of time, and detects the capacitance of the piezo actuator based on a voltage change over that time.

An example of a specific aspect that is used to measure the capacitance of the piezo actuator is a piezo valve in which the capacitance detector is provided with a current supply unit that supplies a test current to the piezo actuator, and a second voltage detection unit that detects a change in a voltage applied to the piezo actuator.

In order to ensure that a test current is not supplied while a drive voltage is being output from the drive circuit and while control of the voltage and current is being performed, and to additionally enable any changes in the voltage generated in the piezo actuator that are caused by the test current to be easily ascertained, it is desirable that there be further provided a second diagnosis timing control unit that, in a case in which the drive circuit is not outputting a drive voltage, causes the current supply unit to output the test current.

According to a fluid control device that is provided with the piezo valve according to the present invention, and a valve control unit that controls the valve opening of the piezo valve, it is possible to perform substantially continuous monitoring of the state of a piezo valve, while also controlling the flow rate and pressure of a fluid in this piezo valve. Accordingly, it is possible to accurately predict the remaining lifespan of the piezo valve, and, compared to the conventional technology, it becomes possible to reduce the number of times a piezo valve is replaced, and to also shorten the time required for performing maintenance.

Effects of the Invention

According to the above-described present invention, it is possible to monitor leakage current from the piezo actuator using the leakage current detector even while a fluid is flowing between the valve seat and the valve body, and while the fluid is being controlled via a drive voltage output from the drive circuit. Accordingly, because it is possible to perform substantially continuous monitoring of the state of the piezo actuator irrespective of whether or not the piezo valve is currently in operation, it is possible to improve the accuracy of a remaining lifespan prediction compared to the conventional technology.

BEST EMBODIMENTS FOR IMPLEMENTING THE INVENTION

A piezo valve 4 and fluid control device 100 according to an embodiment of the present invention will now be described with reference to the drawings.

Figure 1:
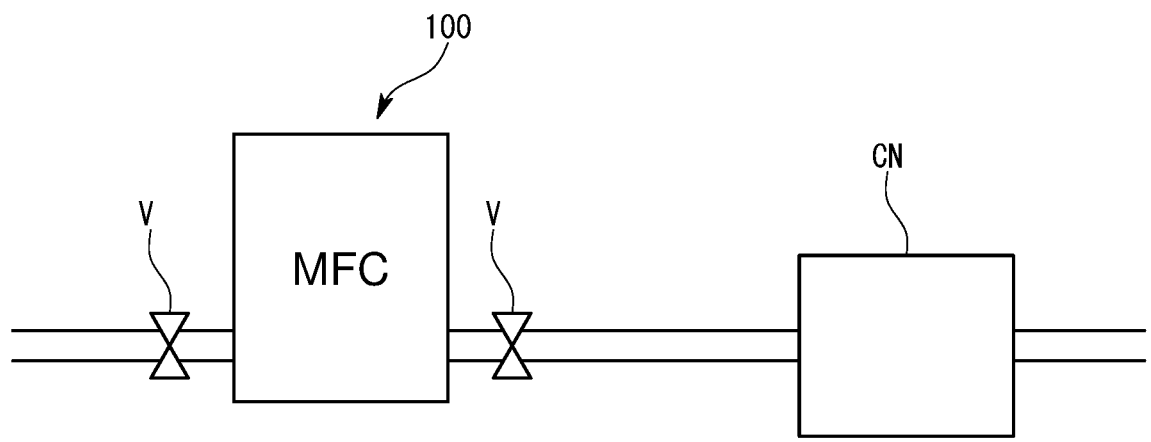
FIG. 1 is a schematic view showing an example of a use of a fluid control device provided with a piezo valve according to an embodiment of the present invention.

The fluid control device 100 of the present embodiment shown in FIG. 1 is what is known as a mass flow controller, and is used, for example, to control a flow rate of a gas supplied to a chamber. Note that the fluid control device 100 controls a fluid and may also be a device that controls a liquid instead of a device that controls a gas, as is the case in the present embodiment.

Firstly, an outline of the fluid control device 100 will be described and, thereafter, a detailed description of the piezo valve 4 will be given.

As is shown in FIG. 1, the fluid control device 100 is provided on a flow path that is connected to a chamber CN, and controls a flow rate of gas that is supplied to the chamber CN. Additionally, in the present embodiment, an opening/closing valve V is provided on both an upstream side and a downstream side of the fluid control device 100. Gas is supplied at a controlled flow rate either continuously or intermittently to the chamber CN, and these opening/closing valves V are opened during processing periods when various types of processing are performed. In contrast, each opening/closing valve V is closed in OFF periods when the supply of gas to the chamber CN is halted for a predetermined length of time or more.

Figure 2:
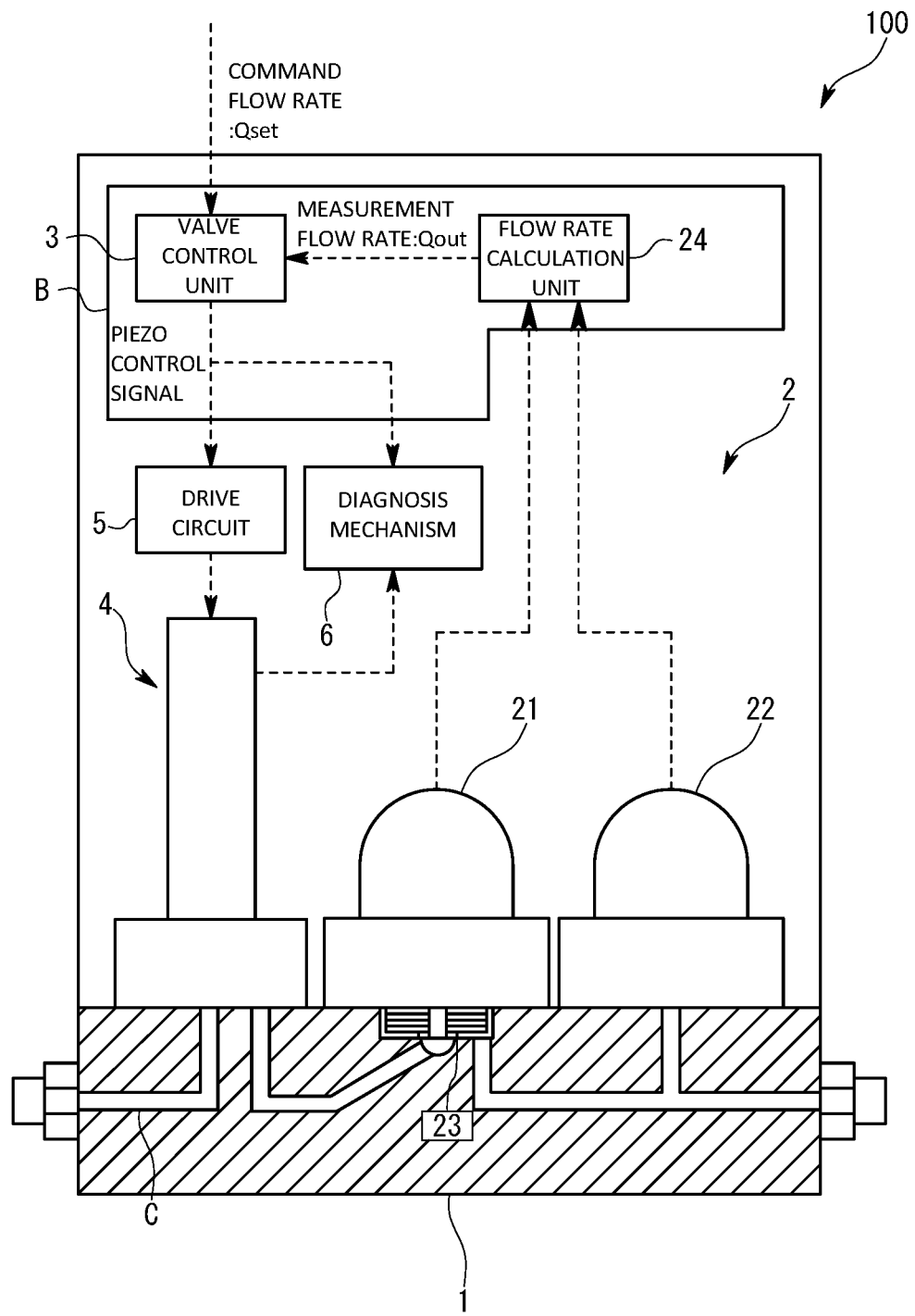
FIG. 2 is a schematic view showing a piezo valve and fluid control device according to the same embodiment.

In the present embodiment, in order to ascertain the extent of damage and deterioration to the piezo valve 4 shown in FIG. 1 and FIG. 2 that is used in the fluid control device 100, or to predict a remaining lifespan of this piezo valve 4, leakage current and capacitance of a piezo actuator 41 that is used in the piezo valve 4 are monitored. This monitoring is performed not only during the OFF periods when gas is not being supplied to the chamber CN, but also during processing periods when gas is being supplied to the chamber CN. In other words, a structure is employed that enables the state of the piezo valve 4 itself to be ascertained substantially continuously while the fluid control device 100 is performing fluid control.

As is shown in FIG. 2, the fluid control device 100 is provided with a body 1 inside which is formed a flow path C, the piezo valve 4, a flow rate sensor 2, and a control board B that governs control and the like. The piezo valve 4 and the flow rate sensor 2 are mounted on an upper surface of the body 1, while the control board B and the like are housed under a cover that covers the upper surface of the body 1. In this way, the sensors, controllers, and actuators that are required for flow rate control are packaged in the fluid control device 100.

The flow rate sensor 2 is a pressure-type flow rate sensor, and is formed by a laminar flow element 23 that is provided on the flow path C, a first pressure sensor 21 that is provided so as to be able to measure pressure on the upstream side of the laminar flow element 23, a second pressure sensor 22 that is provided so as to be able to measure pressure on the downstream side of the laminar flow element 23, and a flow rate calculation unit 24 that calculates a flow rate of a fluid flowing through the flow path based on a first pressure and a second pressure measured by the first pressure sensor 21 and the second pressure sensor 22. Note that, in the first embodiment, a pressure-type flow rate sensor is used, however, it is also possible, for example, for a thermal-type flow rate sensor to be used instead.

The control board B is a computer provided with a CPU, memory, an A/D converter, a D/A converter, and various types of input/output devices, and various types of functions are able to be performed as a result of programs stored in the memory being executed enabling the computer to operate in collaboration with various types of devices. In other words, the control board B performs the functions of at least the aforementioned flow rate calculation unit 24 and of a valve control unit 3. In addition, logic operations of a diagnosis mechanism 6 which forms part of the piezo valve 4 are also performed using computation resources of the control board B.

The valve control unit 3 controls the valve opening of the piezo valve 4 based on set flow rates which are input from the outside, and on measurement flow rates measured by the flow rate sensor 2. More specifically, the valve control unit 3 controls the valve opening of the piezo valve 4 so that any deviation between the set flow rate and the measurement flow rate is reduced. In other words, a PID operation is performed based on the deviation between the set flow rate and the measurement flow rate, and on a PID coefficient, which is a set control coefficient, and outputs a piezo control signal that corresponds to the result of this PID operation to a drive circuit 5. Note that, in the present embodiment, in a case in which the piezo valve 4 is set in a fully open state, one of two types of piezo control signals is output in accordance with the situation. More specifically, in a case in which, for example, the time for which the maximum flow rate is maintained in the set flow rate is within a predetermined time, the valve control unit 3 outputs a piezo control signal corresponding to a drive voltage of 100%, which is the maximum rated voltage, from the drive circuit 5 (described below). Moreover, in a case in which the time for which the maximum flow rate is maintained in the set flow rate is longer than a predetermined time, the valve control unit 3 outputs a piezo control signal corresponding to a voltage for leakage current detection, which is a larger voltage than the maximum rated voltage, from the drive circuit 5. Here, this voltage for leakage current detection is set, for example, to 120% relative to a maximum rated voltage of 100%. Note that an allowable voltage at which the piezo actuator 41 is able to operate without malfunctioning is, for example, 140%.

Figure 3:
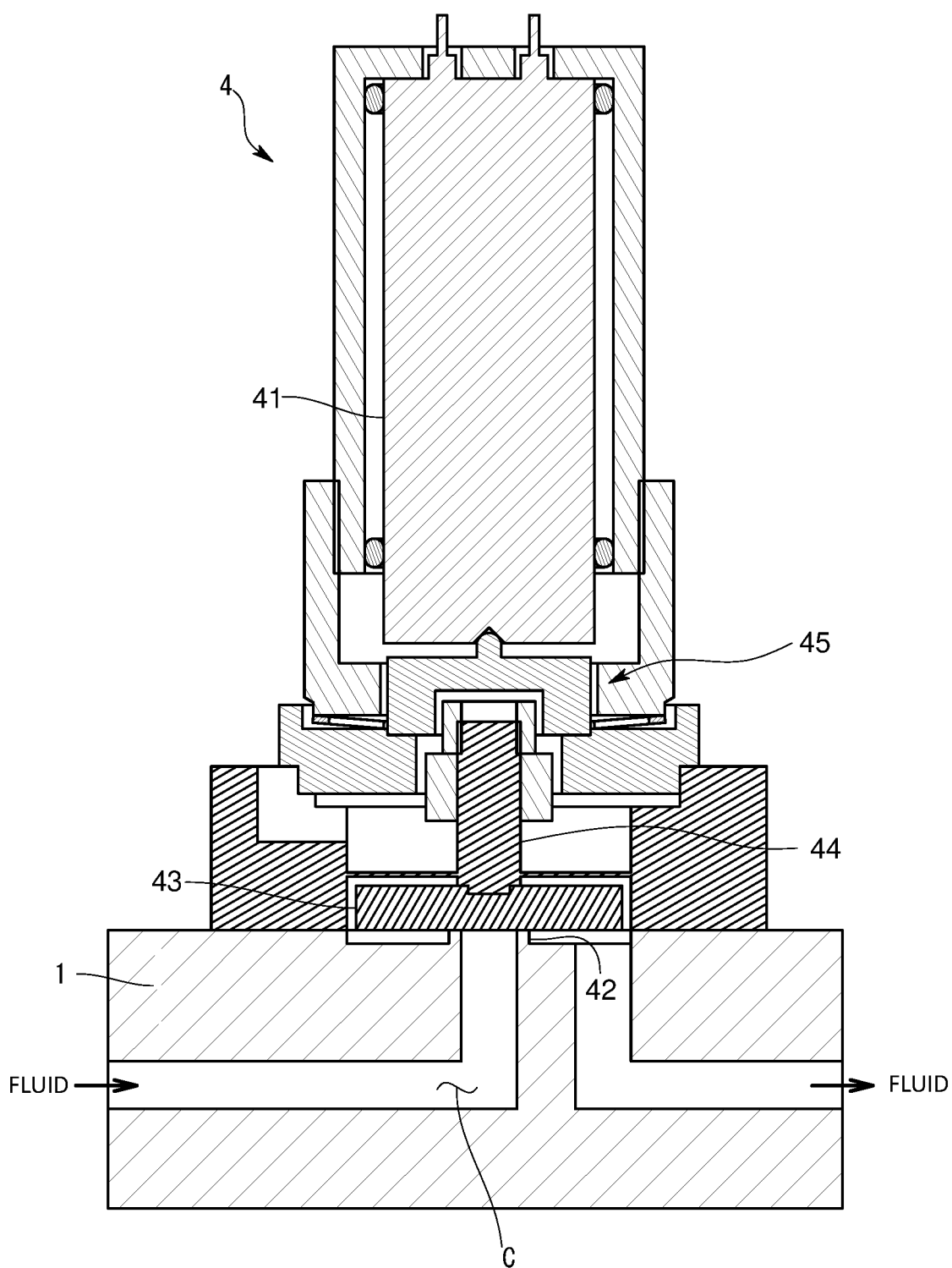
FIG. 3 is a schematic cross-sectional view showing a structure of the piezo valve according to the same embodiment.

As is shown in FIG. 3, the piezo valve 4 is provided with a valve seat 42 that is formed so as to surround a portion where the internal flow path C opens in the upper surface of the body 1, a valve body 43 that is provided so as to be able to move towards or away from the valve seat 42, a piezo actuator 41 that exerts drive force that alters the position of the valve body 43 relative to the valve seat 42, and a plunger 44 and a displacement inversion mechanism 45 that connect together the valve body 43 and the piezo actuator 41. In other words, the piezo valve 4 is formed as a normal close type of valve, and is formed such that, when the piezo actuator 41 is extended as a result of an action of the displacement inversion mechanism 45, the valve body 43 is lifted up from the valve seat 42.

More specifically, the valve body 43 is provided so as to be able to move relative to the valve seat 42 which is formed around the periphery of the aperture of the internal flow path C between a fully closed position where the valve body 43 is in contact with the valve seat 42, and a fully open position where the valve body 43 is separated by a predetermined distance from the valve seat 42. The valve body 43 is disposed at a desired position between the fully closed position and the fully open position. When the size of the orifice formed between the valve seat 42 and the valve body 43 is altered, a corresponding flow rate is achieved.

In the present embodiment the piezo valve 4 is provided with a function of diagnosing a state of the piezo actuator 41. More specifically, as is shown in FIG. 2, the piezo valve 4 is further provided with the drive circuit 5 that outputs a drive voltage to the piezo actuator 41, and the diagnosis mechanism 6 that detects the leakage current and capacitance of the piezo actuator 41, and thereby diagnoses the state of the piezo actuator 41. Note that, in the present embodiment, the drive circuit 5 and diagnosis mechanism 6 are formed as mutually independent electrical circuits, however, they may also be configured using the functions of the control board B of the fluid control device 100.

Figure 4:
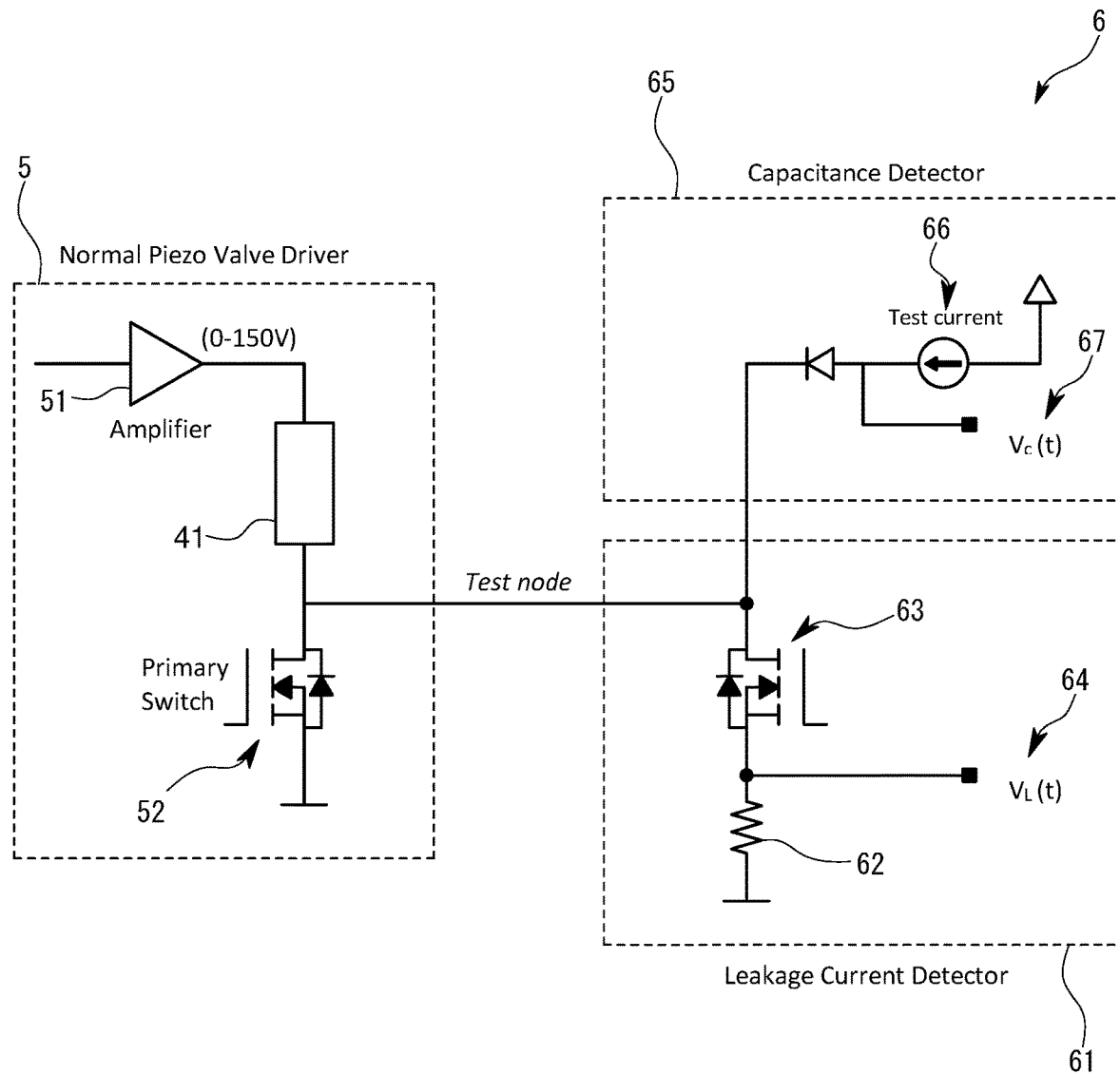
FIG. 4 is a function block diagram showing a structure of a diagnosis mechanism according to the same embodiment.

As is shown in FIG. 2, the drive circuit 5 receives piezo control signals input from the valve control unit 3, and outputs a drive voltage to the piezo actuator 41 in accordance with the input piezo control signals. As is shown in FIG. 4, the drive circuit 5 is provided with an amplifier 51 that amplifies the input piezo control signals so as to generate the drive voltage, and an output terminal of the amplifier 51 is connected to the piezo actuator 41. The drive circuit 5 is further provided with a first switching element 52 between the piezo actuator 41 and the ground, and a test node that is connected to the diagnosis mechanism 6 branches off from between the piezo actuator 41 and the first switching element 52.

Figure 5:
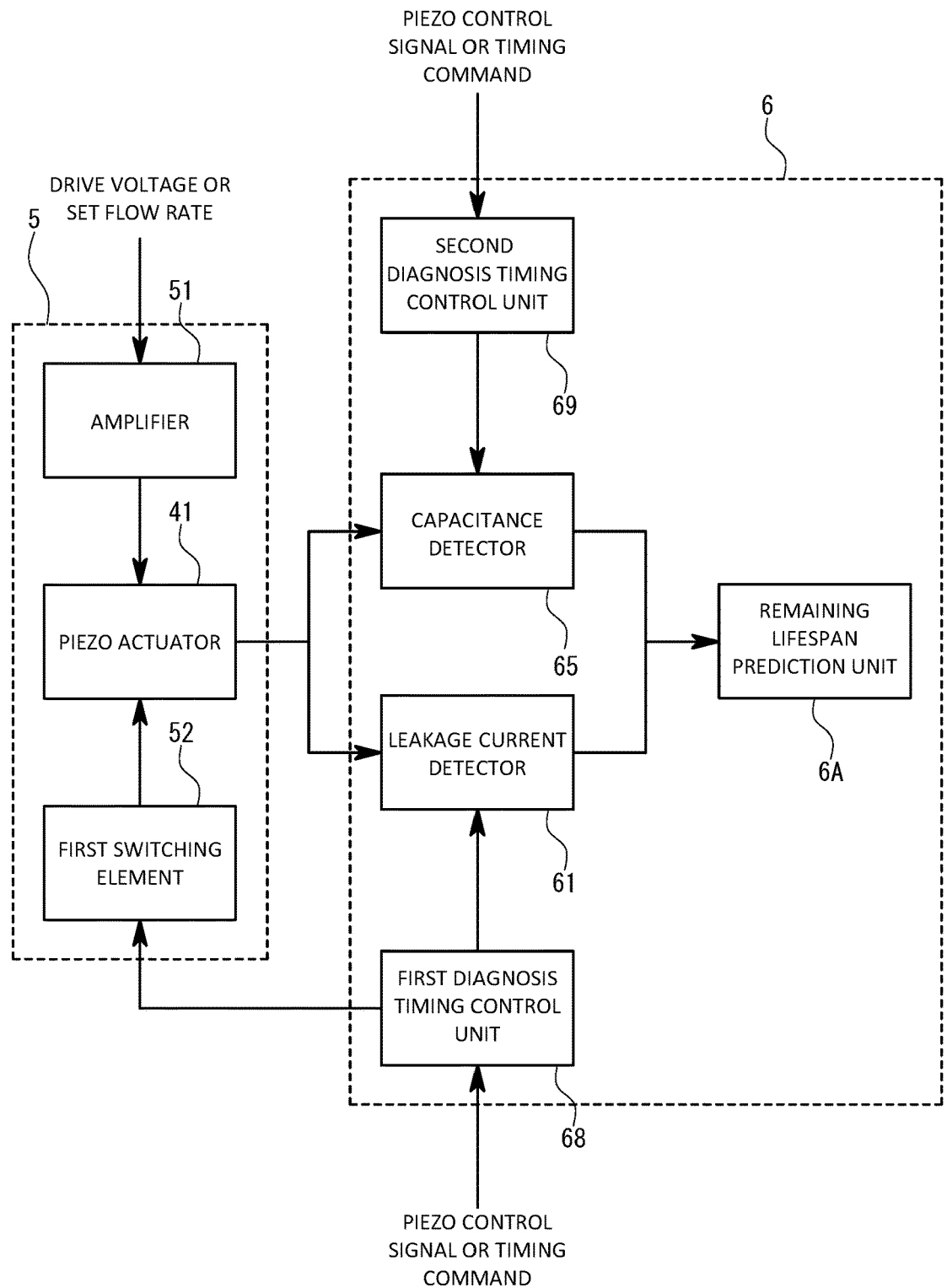
FIG. 5 is a schematic circuit diagram showing circuitry forming the diagnosis mechanism according to the same embodiment.

The diagnosis mechanism 6 is not limited to performing diagnosis solely during OFF periods in which the respective opening/closing valves V are closed and the fluid control device 100 is not supplying gas to the chamber CN, but also performs diagnosis during processing periods in which gas is being supplied to the chamber CN and the fluid control device 100 is controlling the flow rate of this gas. More specifically, as is shown in FIG. 4 and FIG. 5, the diagnosis mechanism 6 is provided with a leakage current detector 61 that detects leakage current from the piezo actuator 41, and a capacitance detector 65 that detects a capacitance of the piezo actuator 41. In addition, in the present embodiment the diagnosis mechanism 6 is provided with a first diagnosis timing control unit 68 that controls timings when the leakage current detector 61 detects leakage current, a second diagnosis timing control unit 69 that controls timings when the capacitance detector 65 detects capacitance, and a remaining lifespan prediction unit 6A that predicts a remaining lifespan of the piezo actuator 41 based on detection results obtained by the leakage current detector 61 and the capacitance detector 65.

As is shown in FIG. 4, the leakage current detector 61 is equipped with a second switching element 63 that is provided in parallel with the first switching element 52 relative to the piezo actuator 41 via a test node, a detection resistor 62 that is provided in series with the second switching element 63 and is formed so as to receive a flow of leakage current from the piezo actuator 41 in a state in which the first switching element 52 is OFF and the second switching element 63 is ON, a first voltage detection unit 64 that detects a voltage generated in the detection resistor 62, and a leakage current calculation unit (not shown in the drawings) that calculates leakage current from the voltage detected by the first voltage detection unit 64. Note that because the voltage generated in the detection resistor 62 by the leakage current is substantially proportional to the leakage current, it is possible to calculate the leakage current by, for example, dividing the detected voltage by a resistance value from the resistance detector 62.

Here, the timings at which the leakage current detector 61 detects leakage current are controlled by the first diagnosis timing control unit 68 switching the first switching element 52 and the second switching element 63 ON and OFF.

Figure 6:
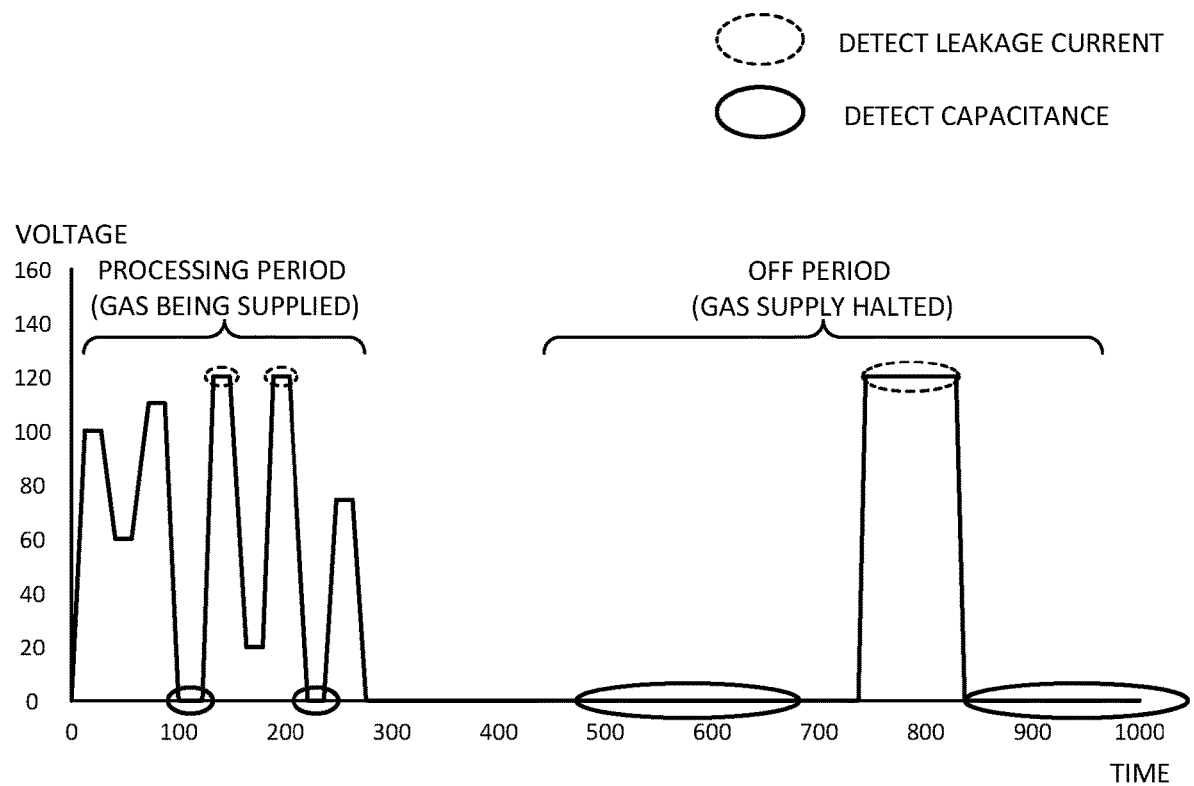
FIG. 6 is a schematic view showing timings when leakage current and capacitance are monitored according to the same embodiment.

More specifically, the first timing control unit 68 illustrated in detail in FIG. 5 controls the timings at which leakage current is detected based on piezo control signals output from the valve control unit 3 or on timing commands input by a user. For example, as is shown in FIG. 6, leakage current is detected in a case in which, during a processing period, a voltage that is equal to or greater than the maximum rated voltage is output continuously for a predetermined length of time or longer from the drive circuit 5, and the piezo valve 4 is maintained for a predetermined length of time in a fully open state. Note that this predetermined length of time may be, for example, between approximately 1-2 seconds, and is the time for which the fully open state is maintained.

Here, during normal flow rate control, the first switching element 52 is set to ON, and the second switching element 63 is set to OFF so that, in terms of circuitry, the detection resistor 62 is no longer connected. In contrast, as is described above, during a processing period, when a voltage that is equal to or greater than the maximum rated voltage that is suitable for detecting leakage current is output from the drive circuit 5, the first diagnosis timing control unit 68 sets the first switching element 52 to OFF, and sets the second switching element 63 to ON. As a result of this, the circuitry is switched so that the current flows from the piezo actuator 41 to the ground via the detection resistor 62.

In the present embodiment, a structure is employed in which a voltage that is larger than the maximum rated voltage corresponding to the fully open state is applied at a timing at which the valve opening of the piezo valve 4 is fully open and this valve opening does not change even if a larger voltage is subsequently applied, so that there are no changes in the flow rate even when leakage current detection is being performed. Note that if the fully closed state of the piezo valve 4 is released during a processing period, then the first diagnosis timing control unit 68 returns the first switching element 52 to an ON state and the second switching element 63 to an OFF state.

In contrast, during an OFF period in which the respective opening/closing valves V are fully closed, based, for example, on a predetermined timing command that is set in order for a user to perform a diagnosis on the piezo valve 4, as is shown in FIG. 6, the drive circuit 5 outputs a voltage that is larger than the maximum rated voltage, and the first diagnosis timing control unit 68 sets the first switching element 52 to an OFF state, and the second switching element 63 to an ON state.

In this way, the leakage current detector 61 detects leakage current from the piezo actuator 41 during both processing periods and OFF periods. In other words, the leakage current detector 61 is able to monitor the state of leakage current from the piezo valve 4 in substantially real time while processing is continuing.

Next, the capacitance detector 65 will be described. The capacitance detector 65 detects the capacitance of the piezo actuator 41 in a state in which, in order to place the piezo valve 4 in a fully closed state, no drive voltage is output from the drive circuit 5. More specifically, in a state in which drive voltage is not being applied to the piezo actuator 41, the capacitance detector 65 supplies a test current for a predetermined length of time to the piezo actuator 41 and detects the capacitance of the piezo actuator 41 based on a voltage change at this time.

As is shown in FIG. 4, the capacitance detector 65 is provided with a current supply unit 66 that supplies a test current to the piezo actuator 41 via the test node, a second voltage detection unit 67 that detects changes in the voltage applied to the piezo actuator 41, and a capacitance calculation unit (not shown in the drawings) that calculates the capacitance of the piezo actuator based on the voltage detected by the second voltage detection unit 67. The current supply unit 66 supplies a test current having a constant current value to the piezo actuator 41 for, for example, approximately one second. The capacitance calculation unit calculates the capacitance using the following formula: $C=it/v$, wherein C is the capacitance of the piezo actuator 41, i is the current value of the test current, t is the time for which the current is supplied, and V is the voltage detected by the second voltage detection unit 67.

Here, the timings at which the current supply unit 66 supplies the test current to the piezo actuator 41 are controlled by the second diagnosis timing control unit 69. More specifically, in a case in which the drive circuit 5 is not outputting a drive voltage, the second diagnosis timing control unit 69 causes the current supply unit 66 to output the test current. In other words, as is shown in FIG. 6, the second diagnosis timing control unit 69 causes the test current to be supplied from the current supply unit 66 in a case in which, during a processing period, no drive voltage is being output from the drive circuit 5, and the fully closed state has been maintained for a predetermined length of time. For example, in a case in which the fully closed state is maintained for 1 to 2 seconds, the second diagnosis timing control causes the test current to be supplied. Note that the current value of the test current is a sufficiently small value, and the voltage generated in the piezo actuator 41 is set so that the valve body 43 does not become separated from the valve seat 42 and release the fully closed state.

Moreover, in an OFF period, based on timing commands set by a user, the second diagnosis control unit causes the current supply unit 66 to supply a test current at desired timings when the piezo valve 4 is in a fully closed state.

In this manner, during both a processing period and an OFF period, the capacitance detector 65 detects the capacitance of the piezo actuator 41.

The remaining lifespan prediction unit 6A predicts the remaining lifespan of the piezo valve 4 based on changes in the leakage current detected by the leakage current detector 61, or on changes in the capacitance detected by the capacitance detector 65. For example, if the leakage current increases due to a deterioration or the like of the piezo valve 4 and exceeds a predetermined threshold value, then the remaining lifespan prediction unit 6A determines that the piezo valve 4 has almost reached the end of its lifespan. Alternatively, if the capacitance of the piezo actuator 41 has decreased and has dropped below a predetermined threshold value, then the remaining lifespan prediction unit 6A determines that the piezo valve 4 has almost reached the end of its lifespan.

In this manner, according to the fluid control device 100 and the piezo valve 4 of the present embodiment, because leakage current detection is performed even during a processing period at timings when a voltage equal to or greater than the maximum rated voltage is applied, changes in the leakage current from the piezo actuator 41 can be monitored substantially continuously. In the same way, because the capacitance of the piezo actuator 41 is also detected during a processing period, changes in the capacitance of the piezo actuator 41 can also be monitored substantially continuously.

Accordingly, because leakage current and capacitance, which are both parameters that are affected by deterioration and the like of the piezo valve 4 can be monitored substantially continuously, it becomes possible to predict the remaining lifespan of the piezo valve 4 in real time, and the accuracy of such a prediction is greatly improved compared to the conventional technology.

Detection of a leakage current during a processing period is performed by applying to the piezo actuator 41 a voltage that is higher than the maximum rated voltage that corresponds to the fully open state of the piezo valve 4 when the piezo valve 4 is placed in a fully open state. Accordingly, the valve opening of the piezo valve 4 is not changed as a result of the operation to detect the leakage current being performed, so that this operation has no effect on the flow rate control.

Additional embodiments will now be described.

In the fluid control device, it is also possible for the remaining lifespan prediction unit to be provided with a notification unit that, when the leakage current or capacitance either exceed or drop below particular threshold values, sends notification that the leakage current or capacitance has exceeded or dropped below a particular threshold value to an operator or to a host terminal.

It is also possible for the diagnosis mechanism to be a mechanism that is able to detect only leakage current from a piezo actuator. In other words, it is also possible to employ a structure in which the leakage current detector is operated so as to detect leakage current in cases in which a voltage that is equal to or greater than a maximum rated voltage is applied, during a processing period, to a piezo actuator. Moreover, in the present embodiment, leakage current from the piezo actuator is detected in a normal close type of piezo valve, however, the present invention may also be applied to a normal open type of piezo valve. In other words, in a piezo valve that is placed in a fully closed state if a maximum rated voltage is applied thereto, then it is sufficient if the leakage current detector is a mechanism that detects leakage current when the piezo valve is fully closed. In this case, in a processing period, a fluid is made to flow between the valve seat and the valve body until a point immediately prior to the leakage detection being performed, and the leakage current detector detects leakage current using a predetermined period after the piezo valve has been fully closed.

The fluid control device is not limited to being a device that controls a flow rate, and may instead be a device that controls pressure. The timings at which the leakage current detector and the capacitance detector respectively detect leakage current and capacitance are also not limited to the timings described in the foregoing embodiment. In addition, the timings at which each parameter is detected may be set automatically if the determination is made by a diagnosis mechanism that satisfies previously set conditions, or may be set manually by a user.

Furthermore, it should be understood that the present invention is not limited to the above-described embodiment, and that various modifications and the like may be made thereto insofar as they do not depart from the spirit or scope of the present invention.

DESCRIPTION OF THE REFERENCE CHARACTERS

100 . . . Fluid Control Device
4 . . . Piezo Valve
41 . . . Piezo Actuator
42 . . . Valve Seat
43 . . . Valve Body
5 . . . Drive Circuit
51 . . . Amplifier
52 . . . First Switching Element
6 . . . Diagnosis Mechanism
61 . . . Leakage Current Detector
62 . . . Detection Resistor
63 . . . Second Switching Element
64 . . . First Voltage Detection Unit
65 . . . Capacitance Detector
66 . . . Fluid Supply Unit
67 . . . Second Voltage Detection Unit
68 . . . First Diagnosis Timing Control Unit
69 . . . Second Diagnosis Timing Control Unit

What is claimed is:

1. A piezo valve comprising:
a valve seat;
a valve body that is provided so as to be able to move between a fully closed position at which the valve body is in contact with the valve seat, and a fully open position;
a piezo actuator that drives the valve body;
a drive circuit that receives an input piezo control signal, and outputs to the piezo actuator a drive voltage that corresponds to the input piezo control signal; and
a leakage current detector that, in a state in which the drive circuit is outputting as the drive voltage to the piezo actuator a voltage that is equal to or greater than a maximum rated voltage that drives the valve body to the fully closed position or the fully open position, detects a leakage current from the piezo actuator, wherein,
in a state in which the leakage current detector is detecting the leakage current from the piezo actuator or in a state immediately prior to the leakage current detector detecting the leakage current from the piezo actuator, a fluid is flowing between the valve seat and the valve body,
the drive circuit comprises:

an amplifier that amplifies the input piezo control signal, and outputs the amplified piezo control signal to the piezo actuator as the drive voltage; and a first switching element that is provided between the piezo actuator and the ground, and the leakage current detector comprises:

a second switching element that is provided in parallel with the first switching element;

a detection resistor that is provided in series with the second switching element, and is formed so as to receive an inflow of the leakage current when the first switching element is in an OFF state and the second switching element is in an ON state; and a first voltage detection unit that detects a voltage generated in the detection resistor.

2. The piezo valve according to claim 1, wherein the leakage current detector detects the leakage current in a state in which the drive circuit is outputting the drive voltage that is larger than the maximum rated voltage for a predetermined length of time.

3. The piezo valve according to claim 1, further comprising:

a first diagnosis timing control unit that, in a case in which the drive circuit is outputting the drive voltage equal to or greater than the maximum rated voltage, sets the first switching element to OFF, and sets the second switching element to ON.

4. The piezo valve according to claim 1, further comprising a capacitance detector that, in a state in which the drive circuit is not outputting the drive voltage to the piezo actuator, detects a capacitance of the piezo actuator.

5. The piezo valve according to claim 4, wherein the capacitance detector supplies a test current to the piezo actuator for a predetermined length of time, and detects the capacitance of the piezo actuator based on a voltage change over that time.

6. The piezo valve according to claim 4, wherein the capacitance detector comprises:

a current supply unit that supplies a test current to the piezo actuator; and a second voltage detection unit that detects a change in a voltage applied to the piezo actuator.

7. The piezo valve according to claim 6, further comprising:

a second diagnosis timing control unit that, in a case in which the drive circuit is not outputting the drive voltage, causes the current supply unit to output the test current.

8. A fluid control device comprising:

the piezo valve according to claim 1; and a valve control unit that controls a valve opening of the piezo valve.

9. A method of diagnosing a piezo valve comprising a valve seat, a valve body that is provided so as to be able to move between a fully closed position at which the valve body is in contact with the valve seat, and a fully open position, a piezo actuator that drives the valve body, and a drive circuit that receives an input piezo control signal, and outputs to the piezo actuator a drive voltage that corresponds to the input piezo control signal, comprising:

detecting leakage current from the piezo actuator in a state in which the drive circuit is outputting as the drive voltage to the piezo actuator a voltage that is equal to or greater than a maximum rated voltage that drives the valve body to the fully closed position or the fully open position; and enabling a fluid to flow between the valve seat and the valve body in a state in which leakage current from the piezo actuator is being detected or in a state immediately prior to leakage current from the piezo actuator being detected, wherein the leakage current is detected by:

receiving an inflow of the leakage current in a detection resistor when a first switching element is in an OFF state and a second switching element provided in parallel with the first switching element and provided in series with the detection resistor is in an ON state, and detecting a voltage generated in the detection resistor; and the drive voltage is outputted by:

amplifying the input piezo control signal, and outputting the amplified piezo control signal to the piezo actuator as the drive voltage.

10. The method according to claim 9, wherein the leakage current is detected in a state in which the drive circuit is outputting the drive voltage that is larger than the maximum rated voltage for a predetermined length of time.

11. The method according to claim 9, wherein the first switching element is set to OFF and the second switching element is set to ON in a case in which the drive circuit is outputting the drive voltage equal to or greater than the maximum rated voltage.

12. The method according to claim 9, wherein a capacitance of the piezo actuator is detected in a state in which the drive circuit is not outputting the drive voltage to the piezo actuator.

13. The method according to claim 12, wherein a test current is supplied to the piezo actuator for a predetermined length of time, and the capacitance of the piezo actuator is detected based on a voltage change over that time.

14. The method according to claim 12, wherein the capacitance of the piezo actuator is detected by supplying a test current to the piezo actuator, and detecting a change in a voltage applied to the piezo actuator.

15. The method according to claim 14, wherein current supply unit is caused to output the test current in a case in which the drive circuit is not outputting the drive voltage.

* * * * *